United States Patent
Draper et al.

(10) Patent No.: US 7,078,929 B1
(45) Date of Patent: Jul. 18, 2006

(54) INTERFACE CONTROLLER USING JTAG SCAN CHAIN

(75) Inventors: Andrew Draper, Chesham (GB); Edward Flaherty, Kingston Bagpuize (GB)

(73) Assignee: Altera Corporation, San Jose, CA (US)

( * ) Notice: Subject to any disclaimer, the term of this patent is extended or adjusted under 35 U.S.C. 154(b) by 97 days.

(21) Appl. No.: 10/882,541

(22) Filed: Jun. 30, 2004

(51) Int. Cl.
*H03K 19/013* (2006.01)
*G01R 31/28* (2006.01)

(52) U.S. Cl. .......................... 326/16; 326/37; 714/724
(58) Field of Classification Search ................... 326/16
See application file for complete search history.

(56) References Cited

U.S. PATENT DOCUMENTS

| | | | |
|---|---|---|---|
| 6,754,862 B1 * | 6/2004 | Hoyer et al. ................. | 714/725 |
| 6,839,873 B1 * | 1/2005 | Moore ......................... | 714/725 |
| 6,925,583 B1 * | 8/2005 | Khu et al. .................... | 714/30 |

* cited by examiner

*Primary Examiner*—James H. Cho
(74) *Attorney, Agent, or Firm*—Townsend and Townsend and Crew LLP

(57) ABSTRACT

In a programmable logic device system, including a programmable logic device, a configuration memory device, for storing configuration information, and a host computer system, for generating updated configuration information, the programmable logic device has a JTAG port, for connection to said host computer system, for receiving said updated configuration information, a JTAG port controller, operatively connected to the first JTAG port, and an SPI interface, for connection to said configuration memory device. The JTAG port controller comprises a scan chain, for controlling said SPI interface on the basis of information received from said host computer system. This allows a user of the host computer system to transfer updated configuration data to the configuration memory device by means of a connection from the host computer system to the JTAG port of the programmable logic device. Since the user will in any event require a connection from the host computer system to the JTAG port of the programmable logic device to allow testing of the device, this will avoid the need for the user to continually switch connections on the programmable logic device.

13 Claims, 2 Drawing Sheets

INTERFACE CONTROLLER USING JTAG SCAN CHAIN

BACKGROUND OF THE INVENTION

This invention relates to integrated circuits, and in particular to the control of an interface of an integrated circuit.

More particularly, the invention relates to a programmable logic device, and to a technique for controlling an interface of a programmable logic device.

A programmable logic device is an integrated circuit, which can be customized by a circuit designer to perform different functions. When a programmable logic device is supplied by a manufacturer, it is typically not capable of performing any particular function, but must first be configured. Programmable logic devices generally comprise an array of logic blocks, which can be programmed to perform desired functions, and which can be arbitrarily connected to each other, and to the inputs and outputs of the device.

The data required in order to program the logic blocks, and the interconnect structure which lies between the logic blocks, is typically stored in a separate configuration memory device.

Therefore, when beginning use of the programmable logic device, this configuration data must be retrieved from the configuration memory device into the programmable logic device in order to cause it to perform the intended function. Moreover, when programming the programmable logic device, this configuration data must be stored in the configuration memory device, and then retrieved into the programmable logic device to confirm whether the device then performs the intended function. It is while programming the programmable logic device that this is a particular concern, because the programmer may make frequent changes to the configuration data, and may therefore wish to confirm at regular intervals that the changes still cause the device to perform the intended function.

SUMMARY OF THE INVENTION

The present invention provides an integrated circuit having JTAG circuitry, which is able to act on received instructions to control an interface to a separate integrated circuit.

In the preferred embodiment of the invention, the JTAG circuitry is able to control the interface to a configuration memory device, in particular a configuration memory device having a SPI interface. The JTAG circuitry is also compatible with the Joint Test Action Group Interface standard, as described in IEEE Standard 1149.1-1990, 'IEEE Standard Test Access Port and Boundary-Scan Architecture'.

Thus, according to a preferred embodiment of the present invention, a programmable logic device system, comprises:

a programmable logic device;

a configuration memory device, for storing configuration information; and a host computer system, for generating updated configuration information, and said programmable logic device comprises:

a JTAG port, for connection to said host computer system, for receiving said updated configuration information;

a JTAG port controller, operatively connected to the first JTAG port; and an SPI interface, for connection to said configuration memory device; and wherein the JTAG port controller comprises a scan chain, for controlling said SPI interface on the basis of information received from said host computer system.

This allows a user of the host computer system to transfer updated configuration data to the configuration memory device by means of a connection from the host computer system to the JTAG port of the programmable logic device. Since the user will in any event require a connection from the host computer system to the JTAG port of the programmable logic device to allow testing of the device, this will avoid the need for the user to continually switch connections on the programmable logic device. This in turn will make updating the configuration data more convenient, and will also reduce the possibility of damage to the connectors.

DETAILED DESCRIPTION OF PREFERRED EMBODIMENTS

Figure 1:
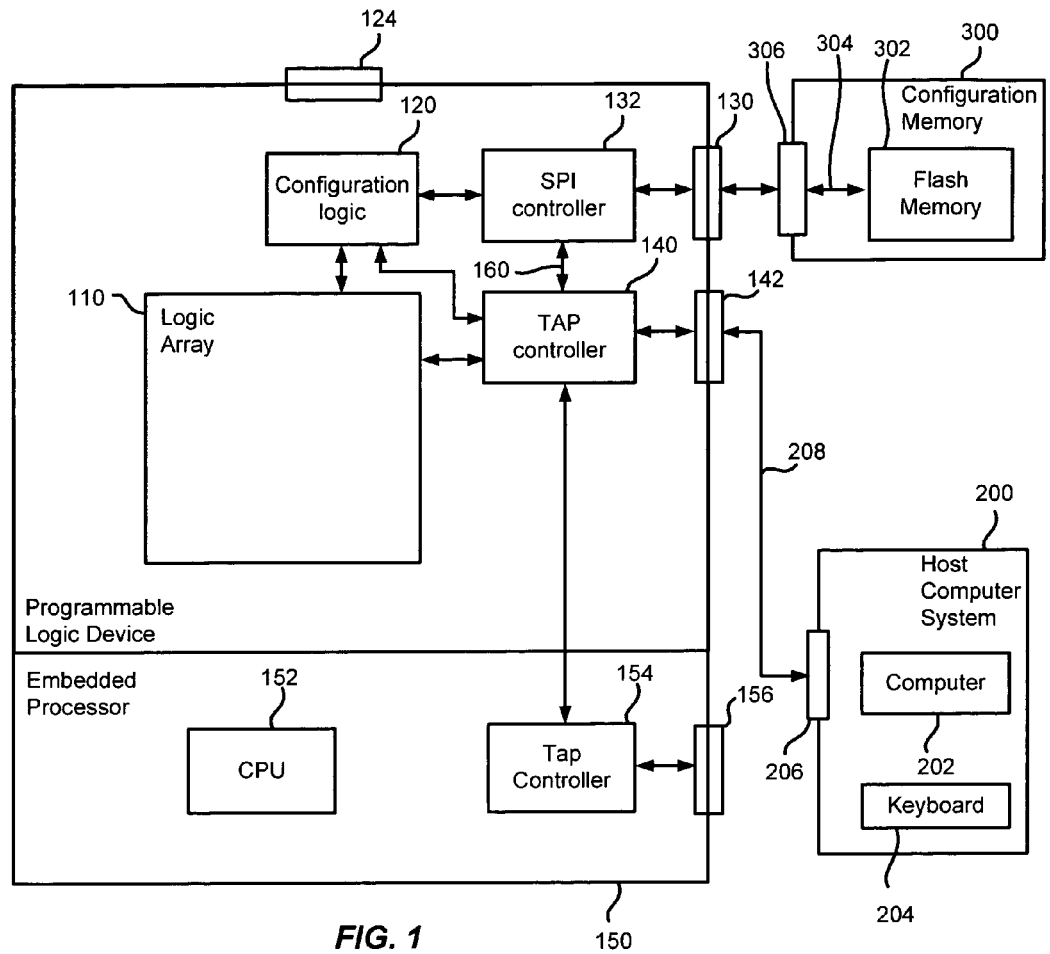
FIG. 1 is a block diagram of a system incorporating an integrated circuit in accordance with the present invention.

FIG. 1 is a block schematic diagram of a computer system, which includes a programmable logic device 100, in accordance with the present invention, a host computer system 200, and a configuration memory device 300.

The programmable logic device 100 is based around a logic array 110, which is made up of configurable logic array blocks, and configurable input-output devices, plus memory blocks and dedicated digital signal processing blocks. The structure of the logic array 110 is not shown in detail, as such structures are well known in themselves, and the details of the structure are not essential to an understanding of the present invention.

As mentioned above, the logic array 110 includes configurable logic array blocks, and configurable input-output devices. These elements perform functions which are assigned to them by configuration data. The configuration data is passed to the logic array 110 when required by means of a configuration logic block 120.

Configuration data can be obtained in two ways. Thus, the programmable logic device 100 has passive configuration pins 124, which can be used in a passive serial mode to receive configuration data when required. However, although the configuration data can be supplied in this way, the present invention is primarily concerned with a mode in which configuration data is supplied to the logic array 110 by means of the configuration logic block 120 from an external configuration memory device.

Thus, configuration data may be stored in a separate configuration memory device, and supplied to the logic array 110 by means of the configuration logic block 120 on system start-up. As illustrated in FIG. 1, the external configuration memory device is an integrated circuit 300, comprising a flash memory block 302, and an SPI bus 304, accessed by means of SPI pins 306.

The programmable logic device 100 therefore also has SPI pins 130, allowing the configuration memory device 300 to be connected to it by means of its SPI pins 306. The data to be transferred by means of the SPI pins 130 is determined by an SPI controller block 132, which is also connected to the configuration logic block 120.

Thus, when the system is initially powered up, configuration data stored in the configuration memory device 300 is retrieved, and used to configure the logic array 110, so that it performs its intended function.

As is conventional, the programmable logic device 100 also has an interface allowing the device to be tested by means of a boundary scan. More specifically, the device includes a Test Action Port (TAP) controller block 140 and JTAG pins 142, defining JTAG circuitry which is also compatible with the Joint Test Action Group Interface standard, as described in IEEE Standard 1149.1-1990, 'IEEE Standard Test Access Port and Boundary-Scan Architecture'.

As is also known from some existing devices, in this illustrated embodiment, the programmable logic device 100 includes an embedded processor 150, which includes a CPU 152, and also includes a separate JTAG interface, including a Test Action Port (TAP) controller block 154 and JTAG pins 156. However, the invention is also applicable to programmable logic devices which do not have an embedded processor.

The system shown in FIG. 1 also includes a host computer system 200, which can be used by a programmer when programming the programmable logic device 100 to perform a new function. The host computer system includes, amongst other things, a computer 202, which may be a conventional PC, and an input system, such as a keyboard 204. The programmer uses the host computer system 200 to input trial configuration data, and then requires to test the programmable logic device 100 to confirm whether the trial configuration data successfully cause the programmable logic device 100 to perform the new function as intended. Depending on the results of that test, the programmer may then need to input amended trial configuration data, and repeat the process.

As also shown in FIG. 1, the host computer system 200 has JTAG pins 206, which can be connected to the JTAG pins 142 of the programmable logic device 100, by means of a standard JTAG cable 208. Conventionally, a connection of a host computer to the JTAG interface of the programmable logic device is used when testing the programmable logic device.

As described so far, the programmable logic device 100 is conventional, and so it will not be described further, since the details will be well known to the person skilled in the art.

As shown in FIG. 1, the programmable logic device 100 has a permanent connection in the form of a hard link 160 between the TAP controller 140 and the SPI controller 132. However, although the invention relates to the control of the SPI interface from the TAP controller 140, it will be appreciated that this permanent connection is not an essential feature of the invention, as the required control signals can be passed indirectly from the TAP controller 140 to the SPI controller 132, for example by way of the logic array 110. The presence of the hard link 160 is however preferred, as it avoids the need for the programmable logic device 100 to be preprogrammed to perform the required data transfer.

Therefore, in accordance with the invention, a programmer is able to enter trial configuration data at the host computer system 200, and transfer this data to the JTAG interface of the programmable logic device 100, and it can then be transferred over the SPI interface to the configuration device.

This allows the connector 208 to be connected to the JTAG pins 142 throughout the process, avoiding the need to repeatedly change the connector 208 between the SPI pins 130 and the JTAG pins 142.

As is conventional, the TAP controller 140 operates using scan chains, which cause specific functions to be carried out. These functions usually relate to the testing of the device. However, in this case, an additional scan chain implemented in the TAP controller 140 drives communications over the SPI interface 130.

Figure 2:
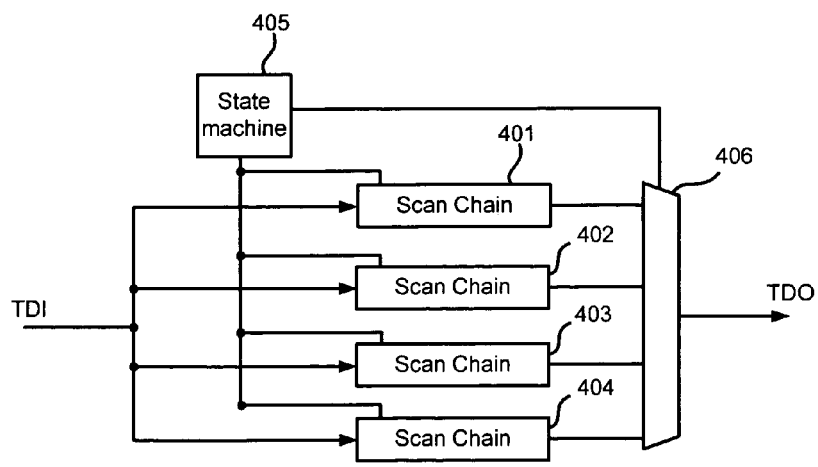
FIG. 2 is an enlarged block diagram of a part of the integrated circuit according to the invention.

FIG. 2 is a schematic diagram illustrating the form of the scan chains within the TAP controller 140. As is conventional, the scan chains, and in particular the scan chain which drives communications over the SPI interface 130, can be implemented in hard logic or in soft logic.

As shown in FIG. 2, an input bit sequence, referred to as an Update Value, is presented on a test data input (TDI) to multiple scan chains 401, 402, 403, 404. Four such scan chains are shown in FIG. 2, although any number of scan chains may be provided. The scan chains operate under the control of a state machine 405, and provide their outputs to a multiplexer 406, which also operates under the control of the state machine 405 so that the output bit sequence from the intended scan chain is provided on the test data output (TDO). This sequence is referred to as the Captured Value. In this case, the scan chains 401, 402, 403 are conventional, having functions relating to the testing of the device, for example, and only the scan chain 404 will be described in further detail.

Figure 3:
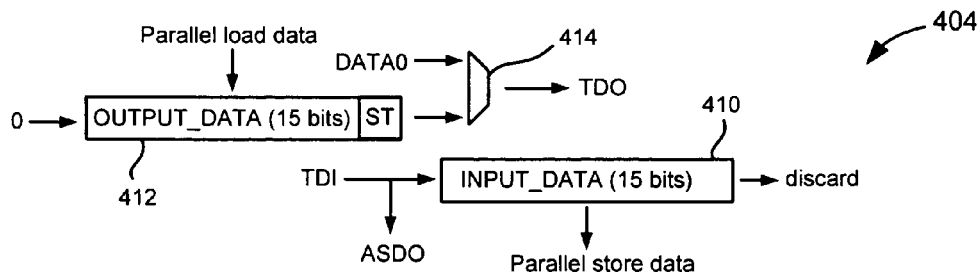
FIG. 3 is a still further enlarged block diagram of a part of the integrated circuit according to the invention.

FIG. 3 shows in more detail the structure of the scan chain 404, which comprises a first shift register 410, a second shift register 412 and a multiplexer 414.

Figure 4:
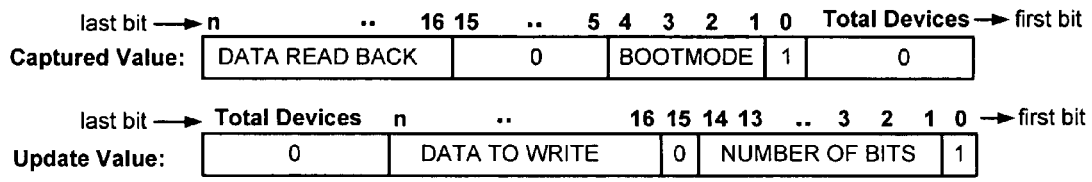
FIG. 4 shows the structure of data used in accordance with the invention.
Figure 5:
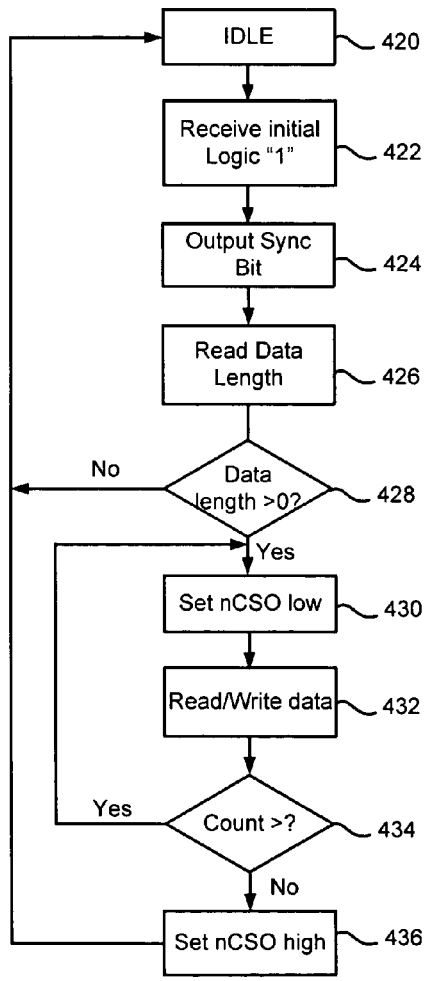
FIG. 5 is a flow chart showing a method in accordance with an aspect of the invention.

FIG. 4 shows the histories of the Update Value on the test data input (TDI) and of the Captured Value on the test data output (TDO) in use of the scan chain 404, and FIG. 5 is a flow chart which then illustrates the operation of the scan chain 404, when the control signal from the state machine 405 indicates that the scan chain 404 is to be active, and the other scan chains 401–403 are deactivated.

Initially, at step 420 in FIG. 5, the scan chain is idling. At this time, a series of zeros is shifted out of the output shift register 412. Then, in step 422 a synchronization bit, in the form of an initial logic "1" is received on TDI. In FIG. 4 this is shown as bit 0 of the Update Value. At this time, in step 424, the scan chain 404 outputs a logic "1" bit, which serves to synchronize the software. In FIG. 4 this is shown as bit 0 of the Captured Value.

During the next 15 clock cycles, in step 426 of FIG. 5, while a status value loaded into the output shift register 412 as parallel data is clocked out as bits 1–15 of the Captured Value, bits 1–15 of the Update Value are scanned into the input shift register 410, and are then stored in parallel as a counter value. This 15 bit value represents the length of the data sequences that are to be written to and read from the SPI interface 130.

In step 428, it is then tested whether the length of the data sequence, as scanned into the shift register 410, is greater than zero. If not, the process returns to step 420, and resumes idling, awaiting a further synchronization bit. Assuming that the length of the data sequence is greater than zero, the process passes to step 430. In step 430, the chip select output (nCSO) of the scan chain is set low. The SPI clock then becomes active, driven by the test clock (TCK) of the TAP controller 140.

After this point, in step 432 of FIG. 5, and referring also to FIG. 3, future bits of the sequence received on TDI are passed not to the input shift register 410 but to the data output (ASDO) of the scan chain for storage, and transfer to the configuration memory 300 over the SPI interface. At the same time, stored data, read from the SPI interface on the DATA0 line, is output by the multiplexer 414 on TDO and returned to the host computer system 200.

Data from the host computer system 200 can thus be written into the configuration memory device 300 by a connection through the JTAG interface 142. At each clock cycle, when one bit of data is read into ASDO and one bit of data is clocked out of DATA0, the stored counter value is decremented, and it is then tested in step 434 whether the counter value remains greater than zero. While the counter value remains greater than zero (that is, during bits 16–n in FIG. 4), data remains to be written, and the process returns to step 430 for the next clock cycle.

When it is determined in step 434 that the counter value has reached zero, the process passes to step 436 and the chip select output (nCSO) of the scan chain is set high, and the SPI clock becomes inactive. The process then returns to step 420, and its idling state, awaiting a further input. Meanwhile software will clock in zeros on TDI. The number of zeros should match the number of zero bits appearing at the start of the Captured Value The illustrated scan chain therefore allows data to be received on the JTAG interface 142 of the device, and passed to the SPI controller 132, rather than requiring the user to make a connection from the host computer system 200 to the SPI interface 130.

This means that, in a test situation, in which a user is frequently applying new configuration data to the programmable logic device 100, and requiring to test whether the new configuration data has the intended effects, the new configuration data can be supplied to the configuration memory device over the JTAG interface, which will also be in use for testing purposes. This avoids the need for the user to continually switch the cable 208 between the JTAG interface 142 and the SPI interface 130 of the programmable logic device.

What is claimed is:

1. A programmable logic device, comprising:
 a first JTAG port, for connection to a host computer system, for receiving updated configuration information;
 a JTAG port controller, operatively connected to the first JTAG port;
 a second port, having an SPI interface for connection to a separate device; and
 an SPI interface controller operatively connected to the SPI interface,
 wherein the JTAG port controller comprises a scan chain, for controlling said SPI interface via the SPI interface controller.

2. A programmable logic device as claimed in claim 1, wherein the scan chain outputs an initial logic "1" on receipt of an initial logic "1" in the input data.

3. A programmable logic device as claimed in claim 1, further comprising:
 a permanent connection between said JTAG port controller and said SPI interface controller.

4. A programmable logic device system, comprising:
 a programmable logic device;
 a configuration memory device, for storing configuration information; and
 a host computer system, for generating updated configuration information,
 wherein said programmable logic device comprises:
  a JTAG port, for connection to said host computer system, for receiving said updated configuration information;
  a JTAG port controller, operatively connected to the JTAG port; and
  an SPI interface, for connection to said configuration memory device; and
  an SPI interface controller, operatively connected to the SPI interface,
  wherein the JTAG port controller comprises a scan chain, for controlling said SPI interface via the SPI interface controller on the basis of information received from said host computer system.

5. A programmable logic device system as claimed in claim 4, wherein the JTAG port controller is operable to transfer updated configuration information, received from said host computer system, to said configuration memory device by means of said SPI interface.

6. A programmable logic device system as claimed in claim 4, wherein said programmable logic device further comprises:
 a permanent connection between said JTAG port controller and said SPI interface controller.

7. A programmable logic device system, comprising:
 a programmable logic device;
 a configuration memory device for storing configuration information; and
 a host computer system, for generating updated configuration information,
 wherein said programmable logic device comprises:
  a JTAG port, for connection to said host computer system, for receiving said updated configuration information;
  a JTAG port controller, operatively connected to the JTAG port; and
  an SPI interface, for connection to said configuration memory device;
  wherein the JTAG port controller comprises a scan chain, for controlling said SPI interface on the basis of information received from said host computer system;
 wherein said host computer system transfers a sequence of data to said JTAG port controller, comprising:
  an initial logic "1", indicating a start of said sequence;
  a predetermined number of bits, representing in binary a length of an updated configuration information sequence; and
  said updated configuration information sequence, and
 wherein said JTAG port controller responds to said sequence of data by:
  reading said predetermined number of bits, to determine the length of the updated configuration information sequence; and
  transferring the updated configuration information to said configuration memory device.

8. An integrated circuit, comprising:
 a first JTAG port;
 a JTAG port controller;
 a second port, having an SPI interface for connection to a separate device; and
 an SPI interface controller operatively connected to the SPI interface,
 wherein the JTAG port controller comprises a scan chain, for controlling said SPI interface via the SPI interface controller.

9. An integrated circuit as claimed in claim 8, wherein the scan chain outputs an initial 1 on receipt of an initial 1 in the input data.

10. A method of storing updated configuration information in a programmable logic device system, comprising:
   a programmable logic device;
   a configuration memory device, for storing configuration information; and
   a host computer system, for generating said updated configuration information, wherein said programmable logic device comprises:
      a JTAG port, for connection to said host computer system;
      a JTAG port controller, operatively connected to the first JTAG port;
      an SPI interface, for connection to said configuration memory device; and
      an SPI interface controller operatively connected to the SPI interface wherein said method comprises the steps of:
         generating updated configuration information in said host computer system;
         transferring information including said updated configuration information from said host computer system to said JTAG port controller by means of said JTAG port; and
         controlling said SPI interface from said JTAG port controller via the SPI controller on the basis of the information received from said host computer system.

11. A method as claimed in claim 10, wherein the JTAG port controller is operable to transfer updated configuration information, received from said host computer system, to said configuration memory device by means of said SPI interface.

12. A method as claimed in claim 10, wherein said JTAG port controller controls said SPI interface controller over a permanent connection between said JTAG port controller and said SPI interface controller.

13. A method of storing updated configuration information in a programmable logic device system, comprising:
   a programmable logic device;
   a configuration memory device, for storing configuration information; and
   a host computer system, for generating said updated configuration information, wherein said programmable logic device comprises:
      a JTAG port, for connection to said host computer system;
      a JTAG port controller, operatively connected to the first JTAG port;
      an SPI interface, for connection to said configuration memory device; and wherein said method comprises the steps of:
         generating updated configuration information in said host computer system;
         transferring information including said updated configuration information from said host computer system to said JTAG port controller by means of said JTAG port; and
         controlling said SPI interface from said JTAG port controller on the basis of the information received from said host computer system,
   wherein said host computer system transfers a sequence of data to said JTAG port controller, comprising:
   an initial logic "1", indicating a start of said sequence;
   a predetermined number of bits, representing in binary a length of an updated configuration information sequence; and
   said updated configuration information sequence, and
   wherein said JTAG port controller responds to said sequence of data by:
      reading said predetermined number of bits, to determine the length of the updated configuration information sequence; and
      transferring the updated configuration information to said configuration memory device.

* * * * *